(12) United States Patent
Arbabi et al.

(10) Patent No.: US 10,403,668 B2
(45) Date of Patent: Sep. 3, 2019

(54) IMAGING APPARATUS AND IMAGE SENSOR INCLUDING THE SAME

(71) Applicants: SAMSUNG ELECTRONICS CO., LTD., Suwon-si (KR); CALIFORNIA INSTITUTE OF TECHNOLOGY, Pasadena, CA (US)

(72) Inventors: Amir Arbabi, Pasadena, CA (US); Seunghoon Han, Suwon-si (KR); Andrei Faraon, Pasadena, CA (US)

(73) Assignees: SAMSUNG ELECTRONICS CO., LTD., Suwon-si (KR); CALIFORNIA INSTITUTE OF TECHNOLOGY, Pasadena, CA (US)

( * ) Notice: Subject to any disclaimer, the term of this patent is extended or adjusted under 35 U.S.C. 154(b) by 256 days.

(21) Appl. No.: 15/221,719

(22) Filed: Jul. 28, 2016

(65) Prior Publication Data
US 2017/0034500 A1 Feb. 2, 2017

Related U.S. Application Data

(60) Provisional application No. 62/198,268, filed on Jul. 29, 2015.

(30) Foreign Application Priority Data

Apr. 11, 2016 (KR) ........................ 10-2016-0044268

(51) Int. Cl.
*H04N 13/00* (2018.01)
*G06T 7/00* (2017.01)
(Continued)

(52) U.S. Cl.
CPC .. *H01L 27/14627* (2013.01); *H01L 27/14605* (2013.01); *H01L 27/14621* (2013.01); *G03B 35/10* (2013.01); *H04N 5/2257* (2013.01)

(58) Field of Classification Search
CPC ......... H01L 27/14627; H01L 27/14625; H01L 27/14605; H01L 27/14621; H04N 5/2257;
(Continued)

(56) References Cited

U.S. PATENT DOCUMENTS 5,760,834 A * 6/1998 Rostoker ........... H01L 27/14618
257/E27.134
8,169,879 B2 5/2012 Kamiguchi et al.
(Continued)

FOREIGN PATENT DOCUMENTS

JP 2011-99715 A 5/2011
KR 10-2016-0120653 A 10/2016
KR 10-2016-0125875 A 11/2016

OTHER PUBLICATIONS

Arbabi et al., "Subwavelength-thick lenses with high numerical apertures and large efficiency based on high-contrast transmitarrays", May 7, 2015, 6 pages total, Nature Communications.

*Primary Examiner* — John R Lee
(74) *Attorney, Agent, or Firm* — Sughrue Mion, PLLC

(57) ABSTRACT

An image sensor includes a substrate, thin lenses disposed on a first surface of the substrate and configured to concentrate lights incident on the first surface, and light-sensing cells disposed on a second surface of the substrate, the second surface facing the first surface, and the light-sensing cells being configured to sense lights passing through the thin lenses, and generate electrical signals based on the sensed lights. A first thin lens and second thin lens of the thin lenses are configured to concentrate a first light and a second light, respectively, of the incident lights onto the light-sensing cells, the first light having a different wavelength than the second light.

17 Claims, 8 Drawing Sheets

(51) Int. Cl.
*H01L 27/146* (2006.01)
*G03B 35/10* (2006.01)
*H04N 5/225* (2006.01)

(58) Field of Classification Search
CPC .. H04N 5/2254; H04N 13/207; H04N 13/204; H04N 13/214; H04N 13/218; H04N 13/229; G03B 35/10; G03B 35/00
See application file for complete search history.

(56) References Cited

U.S. PATENT DOCUMENTS

| | | | |
|---|---|---|---|
| 9,946,051 B2 | 4/2018 | Han et al. | |
| 9,995,930 B2 | 6/2018 | Arabi et al. | |
| 2008/0117519 A1* | 5/2008 | Chari | B29C 33/3842 359/619 |
| 2009/0097381 A1* | 4/2009 | Hamano | G02B 5/1814 369/112.04 |
| 2009/0122178 A1* | 5/2009 | Kwon | H01L 27/14618 348/340 |
| 2009/0219432 A1* | 9/2009 | Palum | G02B 27/2214 348/340 |
| 2011/0122308 A1* | 5/2011 | Duparre | H01L 27/14621 348/340 |
| 2011/0228142 A1* | 9/2011 | Brueckner | H04N 5/2254 348/241 |
| 2012/0091551 A1* | 4/2012 | Marenco | H01L 27/14625 257/432 |
| 2012/0328240 A1* | 12/2012 | Ma | B82Y 20/00 385/33 |
| 2013/0002253 A1 | 1/2013 | Werner et al. | |
| 2013/0044187 A1* | 2/2013 | Hammes | H04N 5/2256 348/46 |
| 2013/0293760 A1* | 11/2013 | Nisenzon | H04N 9/735 348/336 |
| 2013/0308197 A1* | 11/2013 | Duparre | H01L 27/14621 359/621 |
| 2013/0321581 A1* | 12/2013 | El-Ghoroury | H04N 13/0207 348/46 |
| 2014/0263982 A1* | 9/2014 | Shkunov | G01J 5/0806 250/216 |
| 2014/0267243 A1* | 9/2014 | Venkataraman | G06T 7/0065 345/419 |
| 2014/0267890 A1* | 9/2014 | Lelescu | H04N 9/045 348/373 |
| 2014/0277433 A1* | 9/2014 | Pugh | G02B 1/002 623/6.17 |
| 2014/0307059 A1* | 10/2014 | Haddad | G01B 11/026 348/47 |
| 2014/0354855 A1* | 12/2014 | Venkataraman | H01L 27/14618 348/239 |
| 2015/0061066 A1* | 3/2015 | Murayama | G02B 3/0056 257/432 |
| 2015/0130973 A1 | 5/2015 | Saito et al. | |
| 2015/0373261 A1* | 12/2015 | Rodda | H04N 5/23232 348/218.1 |
| 2016/0198143 A1* | 7/2016 | Ishiga | G03B 35/08 348/49 |
| 2016/0299337 A1* | 10/2016 | Arbabi | G02B 27/0031 |
| 2017/0034500 A1* | 2/2017 | Arbabi | H01L 27/14605 |
| 2018/0020209 A1* | 1/2018 | Ko | G01S 7/4815 |
| 2018/0084238 A1* | 3/2018 | Chossat | H04N 13/0207 |

\* cited by examiner

IMAGING APPARATUS AND IMAGE SENSOR INCLUDING THE SAME

CROSS-REFERENCE TO RELATED APPLICATIONS

This application claims priority from U.S. Provisional Patent Application No. 62/198,268, filed on Jul. 29, 2015, and Korean Patent Application No. 10-2016-0044268, filed on Apr. 11, 2016, in the Korean Intellectual Property Office, the disclosures of which are incorporated herein by reference in their respective entireties.

STATEMENT REGARDING FEDERALLY SPONSORED RESEARCH OR DEVELOPMENT

This invention was made with government support under Grant No. W911NF-14-1-0345 awarded by U.S. Army. The government has certain rights in the invention.

BACKGROUND

1. Field

Apparatuses and methods consistent with exemplary embodiments relate to image sensors.

2. Description of the Related Art

Optical sensors including semiconductor sensor arrays may be used in mobile devices, wearable devices, and the Internet of Things. Although such devices should be small, it is difficult to reduce the thicknesses of imaging apparatuses included in these devices.

Also, as demand for a 3-dimensional image sensor to be used in the Internet of Things, game devices, and other mobiles has increased, an optical system capable of controlling pathways of light incident onto the 3-dimensional image sensor is needed. However, because a conventional 3-dimensional image sensor includes complicated optical lenses, it has been difficult to manufacture an appropriate 3-dimensional image sensor for use in such devices.

SUMMARY

Exemplary embodiments may address at least the above problems and/or disadvantages and other disadvantages not described above. Also, the exemplary embodiments are not required to overcome the disadvantages described above, and may not overcome any of the problems described above.

Provided are image sensors that may be configured to have a small size and may be configured to obtain 3-dimensional information about an object.

According to an aspect of an exemplary embodiment, an image sensor includes an image sensor includes a substrate, thin lenses disposed on a first surface of the substrate and configured to concentrate lights incident on the first surface, and light-sensing cells disposed on a second surface of the substrate, the second surface facing the first surface, and the light-sensing cells being configured to sense lights passing through the thin lenses, and generate electrical signals based on the sensed lights. A first thin lens and second thin lens of the thin lenses are configured to concentrate a first light and a second light, respectively, of the incident lights onto the light-sensing cells, the first light having a different wavelength than the second light.

The substrate may include sub-substrates, and the thin lenses and the light-sensing cells may be respectively disposed on a first surface and a second surface of each of the sub-substrates.

Each of the thin lenses may include scatterers, and each of the scatterers may have a pillar structure.

An interval distance between a pair of the scatterers may be less than a respective wavelength of light concentrated by a respective one among the thin lenses.

A height of the scatterers may be less than a respective wavelength of light concentrated by a respective one among the thin lenses.

The scatterers may include at least one from among silicon, gallium phosphide, SiC, SiN, and $TiO_2$.

Shapes of the scatterers and interval distances between respective pairs of the scatterers may vary with a respective wavelength of light concentrated by a respective one among the thin lenses.

The image sensor may further include light filters, each of the light filters being configured to filter a respective wavelength of light incident on a respective one among the light-sensing cells.

The image sensor may further include an image synthesizer configured to generate a multi-color image by synthesizing images of different colors, and at least two among the light-sensing cells may produce the images of different colors.

The image sensor may further include an image synthesizer configured to generate a stereo image based on images that are produced by the light-sensing cells.

The image synthesizer may be further configured to extract depth information about an object appearing in the stereo image.

According to an aspect of an exemplary embodiment, an image sensor includes a substrate, thin lenses disposed on a first surface of the substrate and configured to concentrate lights incident on the first surface, and light-sensing cells disposed on a second surface of the substrate, the second surface facing the first surface, and the light-sensing cells being configured to sense lights passing through the thin lenses, and generate electrical signals based on the sensed lights. A first thin lens and second thin lens of the thin lenses may be configured to concentrate a first light and a second light, respectively, of the incident lights to have different focal lengths.

The substrate may include sub-substrates, and the thin lenses and the light-sensing cells may be respectively disposed on a first surface and a second surface of each of the sub-substrates.

The concentrated lights may have predetermined wavelengths.

Each of the thin lenses may include scatterers, and each of the scatterers may have a pillar structure.

An interval distance between a pair of the scatterers may be less than a respective wavelength of light concentrated by a respective one among the thin lenses.

A height of the scatterers may be less than a respective wavelength of light concentrated by a respective one among the thin lenses.

Shapes of the scatterers and interval distances between respective pairs of the scatterers may vary with a respective wavelength of light concentrated by a respective one among the thin lenses.

The image sensor may further include a depth map calculator configured to calculate a defocusing degree of an image that is produced on each of the light-sensing cells, and calculate depth map information about an image that is produced by the incident lights, based on the defocusing degree.

The image sensor may further include a light filter layer configured to filter a wavelength of light incident on each of the light-sensing cells.

BRIEF DESCRIPTION OF THE DRAWINGS

The above and/or other aspects will be more apparent by describing exemplary embodiments with reference to the accompanying drawings.

DETAILED DESCRIPTION

Figure 1:
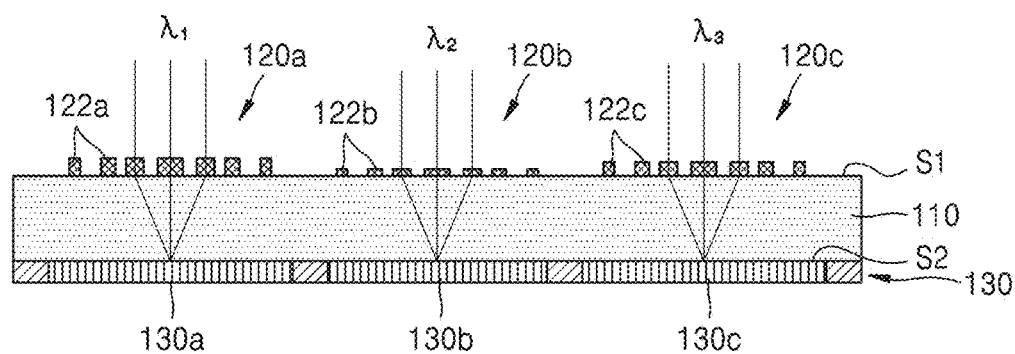
FIG. 1 is a cross-sectional view illustrating an image sensor according to an exemplary embodiment.

Exemplary embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the exemplary embodiments. However, it is apparent that the exemplary embodiments can be practiced without those specifically defined matters. Also, well-known functions or constructions may not be described in detail because they would obscure the description with unnecessary detail.

As used herein, the term "and/or" includes any and all combinations of one or more of the associated listed items. Expressions such as "at least one of," when preceding a list of elements, modify the entire list of elements and do not modify the individual elements of the list.

In the drawings, the thicknesses of layers and regions are exaggerated for clarity. It will also be understood that when a layer is referred to as being "on" another layer or substrate, it can be directly on the other layer or substrate, or intervening layers may also be present.

The terms used in this specification are those general terms currently widely used in the art in consideration of functions in regard to the inventive concept, but the terms may vary according to the intention of those of ordinary skill in the art, precedents, or new technology in the art. Also, specified terms may be selected by the applicant, and in this case, the detailed meaning thereof will be described in the detailed description. Thus, the terms used in the specification may be understood not as simple names but based on the meaning of the terms and the overall description.

Throughout the specification, it will be understood that when a component is connected to another component, the component may be directly connected as well as electrically connected with another element therebetween.

It will be further understood that the terms "comprises" and/or "comprising" used herein specify the presence of stated features or components, but do not preclude the presence or addition of one or more other features or components. In addition, the terms such as "unit," "-er (-or)," and "module" described in the specification refer to an element for performing at least one function or operation, and may be implemented in hardware, software, or the combination of hardware and software.

Additionally, it will be understood that although the terms "first," "second," etc. may be used herein to describe various components, these components may not be limited by these terms. These components are only used to distinguish one component from another.

Descriptions of embodiments below may not be understood as limiting the scope of right, but those easily inferred by one of ordinary skill in the art may be understood as belonging to the scope or right of the exemplary embodiments. Hereinafter, embodiments will be described in detail by referring to the accompanying drawings for the purpose of describing examples only.

FIG. 1 is a cross-sectional view illustrating an image sensor according to an exemplary embodiment.

Referring to FIG. 1, the image sensor according to an exemplary embodiment may include a substrate 110, a plurality of thin lenses 120a, 120b, and 120c that are arranged on a first surface S1, and a plurality of light-sensing cells 130a, 130b, and 130c arranged on a second surface S1 facing the first surface S1 of the substrate 110. At least two from among the thin lenses 120a, 120b, and 120c may concentrate lights having different wavelength components on the light-sensing cells 130a, 130b, and 130c. That is, two or more of the thin lenses 120a, 120b, and 120c may have wavelength selectivity with respect to different wavelengths.

The substrate 110 may have a plate-like shape. The first surface S1 and the second surface S2 of the substrate 110 may be substantially horizontally parallel to each other. However, the first surface S1 and the second surface S2 may not be completely horizontally parallel to each other and may be obliquely parallel to each other. The substrate 110 and the light-sensing cells 130a, 130b, and 130c may be spaced apart from one another with an air layer therebetween. The substrate 110 may include a transparent material. As used herein, the term "transparent material" denotes a material having a high light transmittance. For example, the substrate 110 may include at least one from among $Si_3N_4$, $SiO_2$, and a polymer such as PMMA or PDMS. Once a path of incident light changes at the light-sensing cells 130a, 130b, and 130c, the incident light may pass through the substrate 110 and become incident on a light sensing layer 130.

Each of the light-sensing cells 130a, 130b, and 130c may include scatterers from among a plurality of scatterers 122a, 122b, and 122c. The term 'thin-lens' refers to an optical device that changes a path of light by a difference in phase delays caused by the scatterers 122a, 122b, and 122c included in the thin-lenses, unlike related art optical lens. Accordingly, a thickness of the thin-lens may be hardly limited compared to that of an optical lens, and the thin-lens may be configured to be thin. The scatterers 122a, 122b, and 122c on surfaces of the thin lenses 120a, 120b, and 120c may be configured to resonate light incident on each of the scatterers 122a, 122b, and 122c. The scatterers 122a, 122b, and 122c may be configured to appropriately delay a transmission phase of the light incident on each of the scatterers 122a, 122b, and 122c.

The scatterers 122a, 122b, and 122c may be arranged on the first surface S1 of the substrate 110 to form a desired wave front of light that transmits from the first surface S1 of the substrate 110. Also, the thin lenses 120a, 120b, and 120c may change a path of transmittant light with respect to incident light by modulating a wave front of light.

At least two from among the thin lenses 120a, 120b, and 120c may be configured to concentrate pieces of light having different wavelength components among the incident light on the light sensing layer 130. For example, a first thin-lens 120a may be configured to concentrate a piece of light having a first wavelength $\lambda_1$ among the incident light. Also, a second thin-lens 120b may be configured to concentrate a piece of light having a second wavelength $\lambda_2$ among the incident light. Also, a third thin-lens 120c may be configured to concentrate a piece of light having a third wavelength $\lambda_3$ among the incident light. However, these are provided as examples for illustrative purpose only, and embodiments are not limited thereto. For example, not all of the first to third thin lenses 120a, 120b, and 120c have to concentrate pieces of light having different wavelengths, and two from among the first, second, and third thin lenses 120a, 120b, and 120c may be configured to concentrate pieces of light having substantially the same wavelength.

Figure 2:
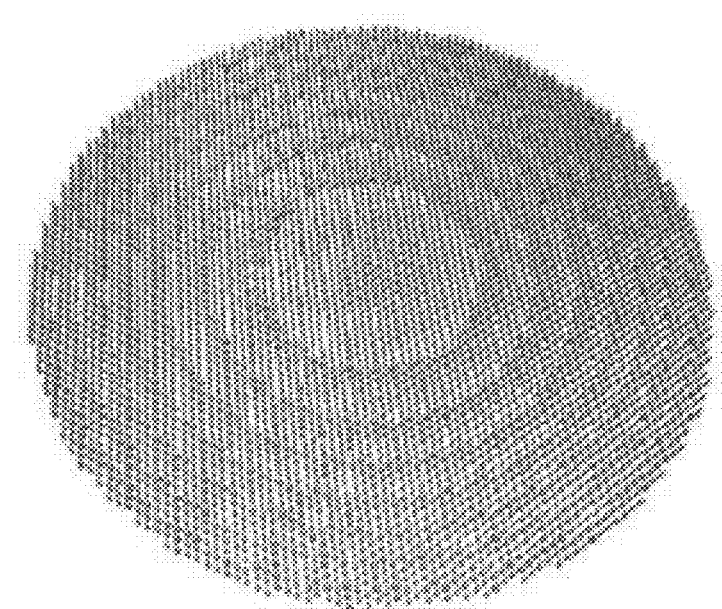
FIG. 2 is a view illustrating a surface of a thin lens according to an exemplary embodiment.

FIG. 2 is a view illustrating a surface of one from among the thin lenses 120a, 120b, and 120c according to an exemplary embodiment.

Referring to FIG. 2, a plurality of scatterers may be arranged on a surface of a thin-lens. A wave form of light transmitted from the thin-lens may depend on a shape, an interval distance, and a shape of arrangement of the scatterers. When the scatterers are formed on the surface of the thin-lens as shown in FIG. 2, light transmitted from the thin-lens may be concentrated. That is, the thin-lens shown in FIG. 2 maybe configured as a lens having positive refractive power.

FIGS. 3A, 3B, 3C, and 3D are perspective views illustrating various shapes of the scatterers 122a, 122b, and 122c according to exemplary embodiments.

Figure 3A:
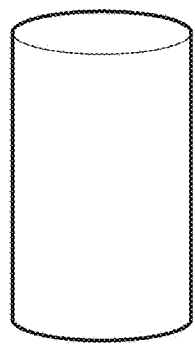
FIGS. 3A, 3B, 3C, and 3D are perspective views illustrating various shapes of scatterers according to exemplary embodiments.
Figure 3B:
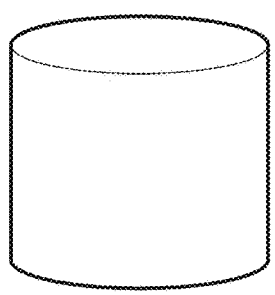
Figure 3C:
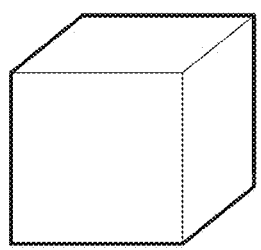
Figure 3D:
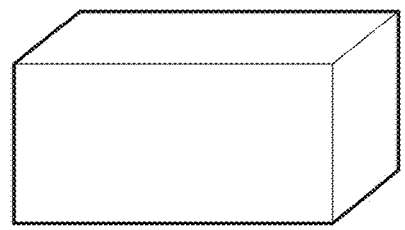

Referring to FIGS. 3A through 3D, the scatterers 122a, 122b, and 122c included in the thin lenses 120a, 120b, and 120c may have pillar structures. A shape of a cross-section of the pillar structure may be from among a circle, an oval, a rectangle, and a square. FIG. 3A illustrates a scatterer having a pillar structure with a cross-sectional shape of a circle. FIG. 3B illustrates a scatterer having a pillar structure with a cross-sectional shape of an oval. FIG. 3C illustrates a scatterer having a pillar structure with a cross-sectional shape of a square. FIG. 3D illustrates a scatterer having a pillar structure with a cross-sectional shape of a rectangle. The pillar structure may be appropriately tilted in a height direction.

FIGS. 3A through 3D show examples of shapes of the scatterers 122a, 122b, and 122c, but embodiments are not limited thereto. For example, at least one from among the scatterers 122a, 122b, and 122c may have a polygonal prism shape or a pillar structure with a cross-section having an "L"-like shape. At least one from among the scatterers 122a, 122b, and 122c may have a multi-layer structure formed of materials with different refractive indexes in a height direction. Also, shapes of the scatterers 122a, 122b, and 122c may not have symmetricity in a direction. For example, a cross-section of the scatterers 122a, 122b, and 122c may have shapes that are non-symmetrical in a horizontal direction such as, for example, an oval shape. Also, when cross-sections of the scatterers 122a, 122b, and 122c differ according to their height, the shapes of the scatterers 122a, 122b, and 122c may not have symmetricity with respect to the height.

The scatterers 122a, 122b, and 122c may have a shape according to wavelength selectivity of the thin lenses 120a, 120b, and 120c. Here, the term "wavelength selectivity" refers to each of the thin lenses 120a, 120b, and 120c selectively concentrating pieces of light of a predetermined wavelength band on the light sensing layer 130. For example, the scatterers 122a included in the first thin-lens 120a may have a shape appropriate to concentrate pieces of light of the first wavelength $\lambda_1$. In one embodiment, a cross-sectional shape of scatterers 122a and a ratio between a width and a height of the scatterers 122a may change. Also, scatterers 122b included in the second thin-lens 120b may have a shape appropriate to concentrate pieces of light of the second wavelength $\lambda_2$. Also, scatterers 122c included in the third thin-lens 120c may have a shape appropriate to concentrate pieces of light of the third wavelength $\lambda_3$. At least two from among the first, second, and third wavelengths $\lambda_1$, $\lambda_2$, and $\lambda_3$ may be different from each other.

Figure 4:
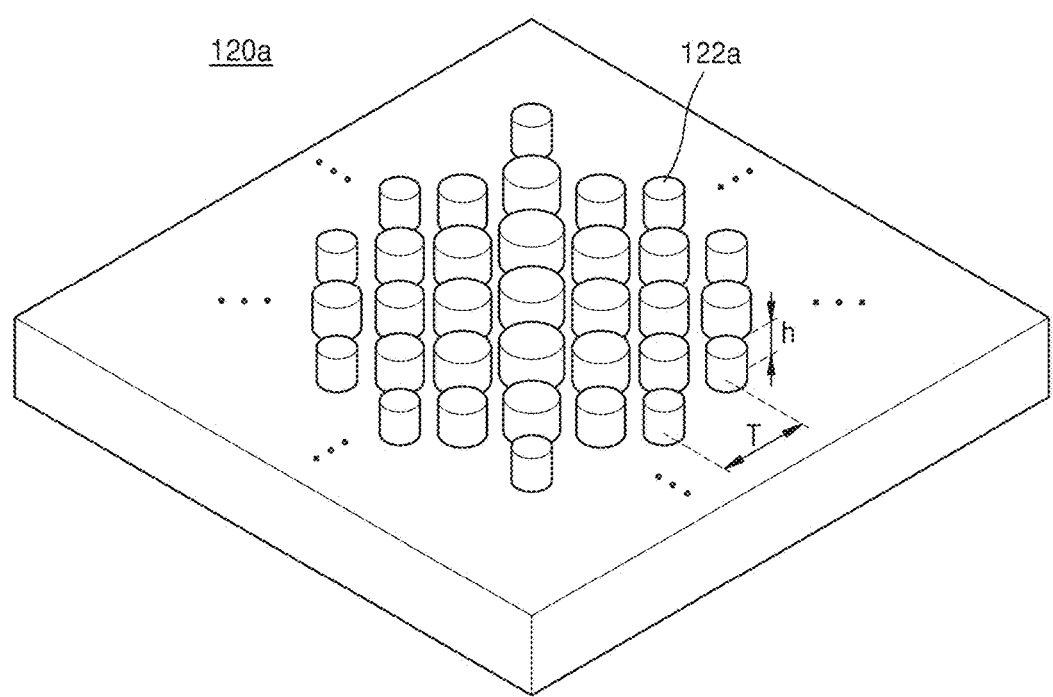
FIG. 4 is a view of a surface illustrating a first thin lens according to an exemplary embodiment.

FIG. 4 is a view illustrating a surface of the first thin-lens 120a according to an exemplary embodiment.

In FIG. 4, the first thin-lens 120a is used as an example, but the description with reference to FIG. 4 may be applied to the second and third thin lenses 120b and 120c.

Referring to FIG. 4, the scatterers 122a having pillar structures may be arranged on the substrate 110. In FIG. 4, the scatterers 122a have circular pillar structures as an example, but embodiments are not limited thereto. For example, the scatterers 122a may have any of various shapes such as polygonal prism shapes, circular cylindrical shapes, or elliptic cylindrical shapes. Alternatively, cross-sections of the scatterers 122a may have "L"-like prism shapes.

A refractive index of a material included in the scatterers 122a may be higher than a refractive index of a material included in the substrate 110. Thus, the substrate 110 may include a material having a relatively low refractive index, and the scatterers 122a may include a material having a relatively high refractive index. For example, the scatterers 122a may include at least one from among crystalline silicon (c-Si), polycrystalline silicon (poly Si), amorphous silicon (amorphous Si), $Si_3N_4$, GaP, $TiO_2$, AlSb, AlAs, AlGaAs, AlGaInP, BP, and $ZnGeP_2$. Also, for example, the substrate 110 may include one from among a polymer such as PMMA or PDMS, $Si_3N_4$, and $SiO_2$. An additional clad layer that surrounds and covers the scatterers 122a having a high refractive index on the substrate 110 with the material having a low refractive index may be formed.

The arrangement of the scatterers 122a may be determined according to a wavelength band of light that is concentrated by the first thin-lens 120a. For example, an interval distance T and an arrangement direction of the scatterers 122a included in the first thin-lens 120a may be determined in correspondence to the first wavelength $\lambda_1$ of light that is concentrated by the first thin-lens 120a. The interval distance T between the scatterers 122a of the first thin-lens 120a may be smaller than the first wavelength $\lambda_1$. In one embodiment, the interval distance T between the scatterers 122a of the first thin-lens 120a may be ¾ of the first wavelength $\lambda_1$ or less or ⅔ of the first wavelength $\lambda_1$ or less. Also, a height h of the scatterers 122a of the first thin-lens 120a may be smaller than the first wavelength $\lambda_1$. For example, the height h of the scatterers 122a of the first thin-lens 120a may be ⅔ of the first wavelength $\lambda_1$ or less.

Figure 5:
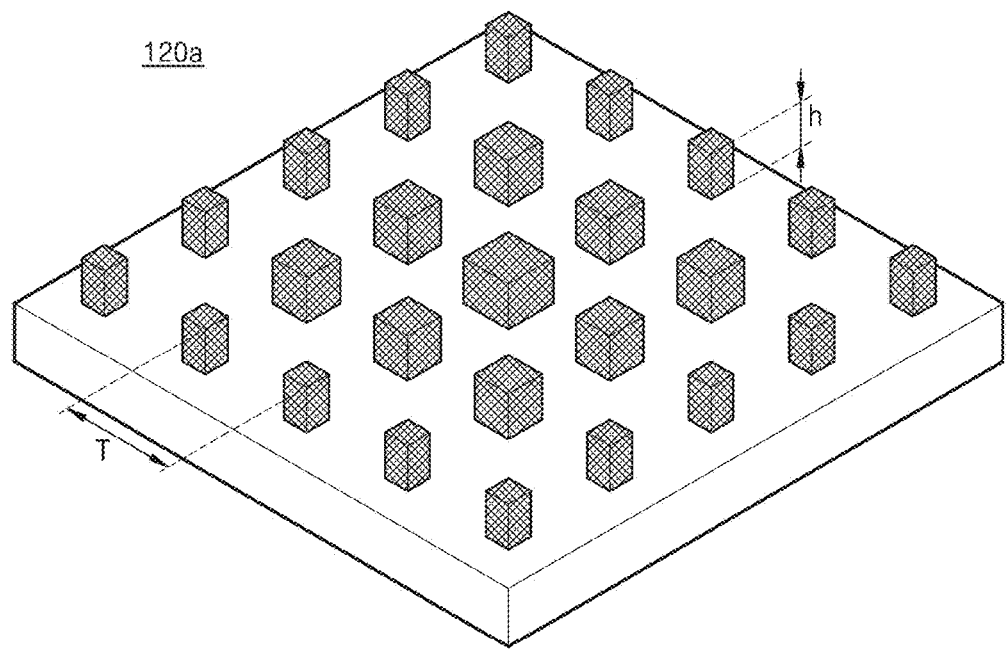
FIG. 5 is a view illustrating a surface of a first thin lens according to another exemplary embodiment.

FIG. 5 is a view illustrating a surface of the first thin lens 120a according to another exemplary embodiment.

Referring to FIG. 5, the scatterers 122a have rectangular parallelepiped shapes and may be arranged on the substrate 110. Although the scatterers 122a have rectangular parallelepiped shapes in FIG. 5, exemplary embodiments are not limited thereto. For example, the scatterers 122a may have any shape including polygonal prism shapes, circular cylindrical shapes, and elliptic cylindrical shapes. Alternatively, cross-sections of the scatterers 122a may have 'L'-like prism shapes. Also, heights and interval distances of the scatterers 122a may vary according to a wavelength selectivity of the first thin-lens 120a.

The description of shapes of the scatterers 122a made with reference to FIGS. 4 and 5 may apply to the scatterers 122b and 122c included in the second and third thin lenses 120b and 120c. However, shapes, interval distances, and arrangement directions of the scatterers 122b and 122c may vary according to a wavelength selectivity of each of the second and third thin lenses 120b and 120c. For example, interval distances and heights of the scatterers 122b included in the second thin-lens 120b may be determined according to the second wavelength $\lambda_2$. The interval distances and heights of the scatterers 122b included in the second thin-lens 120b may be smaller than the second wavelength $\lambda_2$. Also, interval distances and heights of the scatterers 122c included in the third thin-lens 120c may be determined according to the third wavelength $\lambda_3$. The interval distances and heights of the scatterers 122c included in the third thin-lens 120c may be smaller than the third wavelength $\lambda_3$.

Referring back to FIG. 1, the light-sensing cells 130a, 130b, and 130c may be configured to generate electrical signals upon sensing light that transmitted from at least one from among the thin lenses 120a, 120b, and 120c. The light-sensing cells 130a, 130b, and 130c may be formed in the light sensing layer 130. However, exemplary embodiments are not limited thereto, and the light-sensing cells 130a, 130b, and 130c may be separated from each other.

The light-sensing cells 130a, 130b, and 130c may be prepared in correspondence to the thin lenses 120a, 120b, and 120c. For example, a first light-sensing cell 130a may be configured to sense light that is transmitted from the first thin-lens 120a. Also, a second light-sensing cell 130b may be configured to sense light that is transmitted from the second thin-lens 120b. Also, a third light-sensing cell 130c may be configured to sense light that is transmitted from the third thin-lens 120c. The first, second, and third light-sensing cells 130a, 130b, and 130c may be configured to receive light and thus may output first, second, and third images, respectively.

Each of the light-sensing cells 130a, 130b, and 130c may include devices that convert light signals into electrical signals. For example, the light-sensing cells 130a, 130b, and 130c may include CCD sensors or CMOS sensors. Alternatively, the light-sensing cells 130a, 130b, and 130c may include photodiodes that convert light energy into electrical energy.

Because at least two from among the first, second, and third thin lenses 120a, 120b, and 120c have different wavelength selectivities, at least two of the first, second, and third light-sensing cells 130a, 130b, and 130c may be configured to measure images in different colors. Therefore, the first, second, and third images measured by the first, second, and third light-sensing cells 130a, 130b, and 130c, respectively, may be synthesized to obtain a multi-color image.

Figure 6:
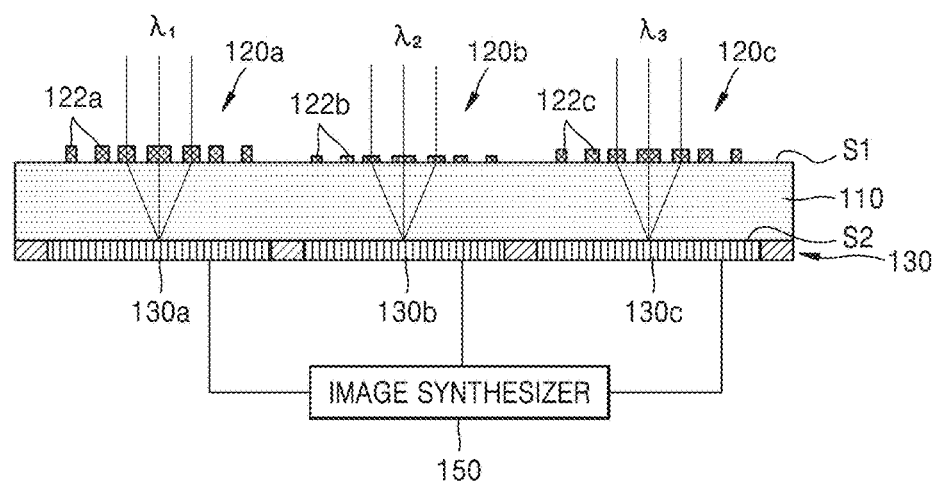
FIG. 6 is a view illustrating an image sensor according to an exemplary embodiment.

FIG. 6 is a view illustrating an image sensor according to an exemplary embodiment.

In FIG. 6, a repeated explanation of the same elements or operations as those in FIG. 1 will not be given.

Referring to FIG. 6, the image sensor according to an exemplary embodiment may include an image synthesizer 150 configured to synthesize images in different colors and thus produces a multi-color image. The image synthesizer 150 may synthesize the first, second, and third images obtained by the first, second, and third light-sensing cells 130a, 130b, and 130c. At least two among the first, second, and third images may be in different colors. Thus, the image synthesizer 150 may produce a multi-color image by synthesizing the first, second, and third images. The multi-color image may be an image in a plurality of colors. Also, when there are four or more light-sensing cells configured to perform an imaging process on four or more different wavelength bands, the multi-color image may be a hyperspectral image.

Because locations of the thin-lens 120a, 120b, and 120c are different from each other, light reflected by an object may be incident at different angles to the thin-lens 120a, 120b, and 120c. Thus, images of the object taken from different angles may be obtained from the first, second, and third light-sensing cells 130a, 130b, and 130c, respectively. The image synthesizer 150 may produce a stereo image from the images of the object taken from different angles. During a process of producing the stereo image, the image synthesizer 150 may extract parallax information among the first, second and third images. Also, the image synthesizer 150 may be configured to extract depth information of the object that is shown in the stereo image.

Figure 7:
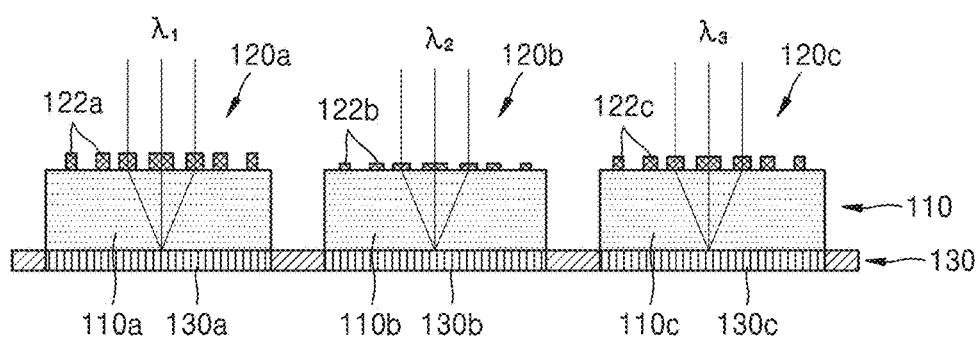
FIG. 7 is a view illustrating an image sensor according to an exemplary embodiment.

FIG. 7 is a view illustrating an image sensor according to an exemplary embodiment.

In FIG. 7, a repeated explanation of the same elements or operations as those in FIG. 1 will not be given.

Referring to FIG. 7, the substrate 110 may include a plurality of sub-substrates 110a, 110b, and 110c. The sub-substrates 110a, 110b, and 110c may be formed in correspondence to a respective thin lens of the the plurality of thin lenses 120a, 120b, and 120c, and a respective light-sensing cell of the plurality of light-sensing cells 130a, 130b, and 130c. For example, the first thin-lens 120a and the first light-sensing cell 130a may be formed on a first and second surface of a first sub-substrate 110a, respectively. Also, the second thin-lens 120b and the second light-sensing cell 130b may be formed on a first and second surface of a second sub-substrate 110b, respectively. Also, the third thin-lens 120c and the third light-sensing cell 130c may be formed on a first and second surface of a third sub-substrate 110c, respectively. When the substrate 110 is divided into the sub-substrates 110a, 110b, and 110c, interference between pieces of light that are incident on each of the light-sensing cells 130a, 130b, and 130c may be prevented.

Figure 8:
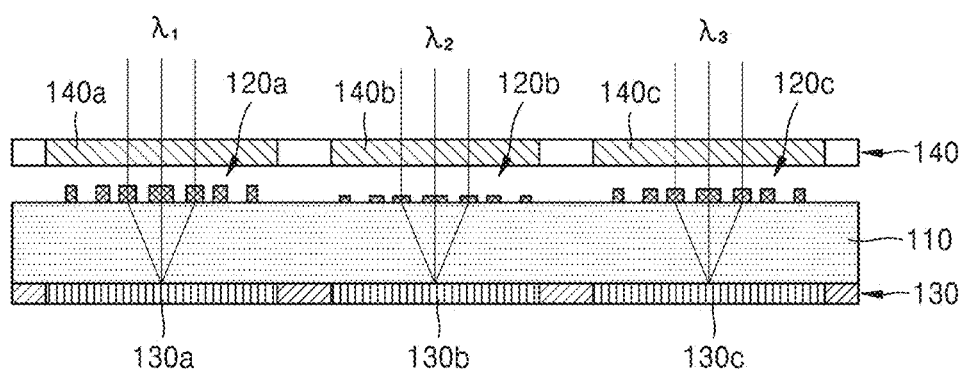
FIG. 8 is a view illustrating an image sensor according to an exemplary embodiment.

FIG. 8 is a view illustrating an image sensor according to an exemplary embodiment.

In FIG. 8, a repeated explanation of the same elements or operations as those in FIG. 1 will not be given.

Referring to FIG. 8, another image sensor according to an exemplary embodiment may include a plurality of light filters 140a, 140b, and 140c, and each light filter in the plurality of light filters 140a, 140b, and 140c is configured to filter wavelength components of pieces of light incident on a respective light-sensing cell of the plurality of light-sensing cells 130a, 130b, and 130c. The plurality of light filters 140a, 140b, and 140c may be included in a single light filter layer 140. However, this is provided herein as an example, and the plurality of light filters 140a, 140b, and 140c may be included in separate light filter layers from one another. The light filters of the plurality of light filters 140a, 140b, and 140c may be prepared in correspondence to a respective light-sensing cell of the plurality of light-sensing cells 130a, 130b, and 130c. For example, a first light filter 140a may filter a wavelength of light incident on the first light-sensing cell 130a. Also, a second light filter 140b may filter a wavelength of light incident on the second light-sensing cell 130b. Also, a third light filter 140c may filter a wavelength of light incident on the third light-sensing cell 130c.

The first light filter 140a may allow only a predetermined wavelength component from incident light to transmit therethrough according to a wavelength selectivity of the first thin-lens 120a. For example, light of the first wavelength $\lambda_1$ from among incident light may transmit through the first light filter 140a, and the first light filter 140a may allow light of the remaining wavelength components to be reflected or absorbed. In the same manner, light of the second wavelength $\lambda_2$ from among incident light may transmit through the second light filter 140b, and the second light filter 140b may allow light of the remaining wavelength components to be reflected or absorbed. Also, light of the third wavelength $\lambda_3$ from among incident light may transmit through the third light filter 140c, and the third light filter 140c may allow light of the remaining wavelength components to be reflected or absorbed.

FIG. 8 shows an example of the light filters 140a, 140b, and 140c formed at locations where light incident on the thin lenses 120a, 120b, and 120c transmit therethrough. However, exemplary embodiments are not limited thereto. For example, the light filters 140a, 140b, and 140c may be formed between the thin lenses 120a, 120b, and 120c and the light-sensing layer 130. In this case, wavelengths of light transmitted through the light filters 140a, 140b, and 140c and the thin lenses 120a, 120b, and 120c may be filtered. In any cases, the light filters 140a, 140b, and 140c may filter wavelength components of light that is incident on the light-sensing cells 130a, 130b, and 130c of the light-sensing layer 130, respectively. Because the light filters 140a, 140b, and 140c filter wavelengths of incident light, a phenomenon of light of a wavelength band beyond the wavelength selectivity of each of the thin lenses 120a, 120b, and 120c (where, the phenomenon is also referred to as "optical crosstalk") may be prevented from being incident on the light-sensing cells 130a, 130b, and 130c. Also, quality of images obtained from the light-sensing cells 130a, 130b, and 130c may improve.

Figure 9:
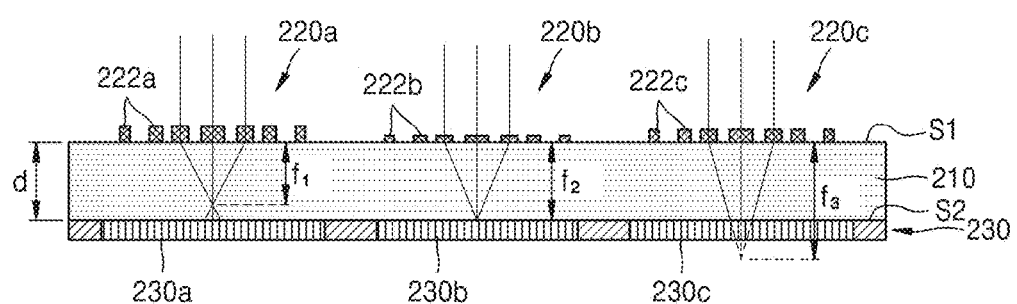
FIG. 9 is a view illustrating an image sensor according to another exemplary embodiment.

FIG. 9 is a view illustrating an image sensor according to another exemplary embodiment.

In FIG. 9, a repeated explanation of the same elements or operations as those in FIGS. 1 through 8 will not be given.

Referring to FIG. 9, the image sensor according to an exemplary embodiment may include a substrate 210, a plurality of thin lenses 220a, 220b, and 220c that are formed on a first surface S1 of the substrate 210 and concentrate pieces of light that are incident on the first surface S1, and a plurality of light-sensing cells 230a, 230b, and 230c that are formed on a second surface S2 facing the first surface S1 of the substrate 210 and generate electrical signals upon sensing light that has transmitted through the plurality of thin lenses 220a, 220b, and 220c.

The substrate 210 may include a transparent material. As used herein, the term "transparent material" denotes a material having a high light transmittance. For example, the substrate 210 may include at least one from among $Si_3N_4$, $SO_2$, and a polymer such as PMMA or PDMS. Once a path of incident light changes by the thin lenses 220a, 220b, and 220c, the incident light may pass through the substrate 210 and be incident on a light sensing layer 230. The substrate 210, similar to an exemplary embodiment shown in FIG. 7, may include a plurality of sub-substrates.

Figure 10:
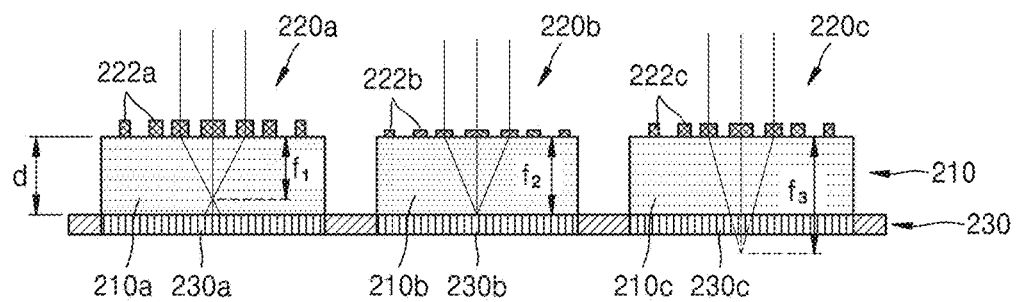
FIG. 10 is a view illustrating an image sensor including a substrate including a plurality of sub-substrates, according to an exemplary embodiment.

FIG. 10 is a view illustrating an example of the substrate 210 including a plurality of sub-substrates 210a, 210b, and 210c, according to an exemplary embodiment.

Referring to FIG. 10, the sub-substrates 210a, 210b, and 210c may be formed in correspondence to a respective thin lens of the plurality of thin lenses 220a, 220b, and 220c and a respective light-sensing cell of the plurality of light-sensing cells 230a, 230b, and 230c. For example, a first thin-lens 220a and a first light-sensing cell 230a may be formed on a first and second surface of a first sub-substrate 210a, respectively. Also, a second thin-lens 220b and a second light-sensing cell 230b may be formed on a first and second surface of a second sub-substrate 210b, respectively. Also, a third thin-lens 220c and a third light-sensing cell 230c may be formed on a first and second surface of a third sub-substrate 210c, respectively. When the substrate 210 is divided into the plurality of sub-substrates 210a, 210b, and 210c, interference between pieces of light that are incident on each of the light-sensing cells 130a, 130b, and 130c may be prevented.

The thin lenses 220a, 220b, and 220c may include a plurality of scatterers 222a, 222b, and 222c. At least two from among the thin lenses 220a, 220b, and 220c may be configured to concentrate pieces of the incident light on the light-sensing cells 230a, 230b, and 230c to have different focal lengths. For example, the first thin-lens 220a may concentrate pieces of the incident light to have a first focal length $f_1$ in a direction toward the first light-sensing cell 230a. Also, the second thin-lens 220b may concentrate pieces of the incident light to have a second focal length $f_2$ in a direction toward the second light-sensing cell 230b. Also, the third thin-lens 220c may concentrate pieces of the incident light to have a third focal length $f_3$ in a direction toward the third light-sensing cell 230c. This is provided herein as an example only, and exemplary embodiments are not limited thereto. For example, the first through third thin lenses 220a, 220b, and 220c do not necessarily have to concentrate pieces of incident light to have focal lengths that are all different from one another, and two from among the first through third thin lenses 220a, 220b, and 220c may concentrate pieces of incident light to have substantially the same focal length.

Descriptions of exemplary embodiments provided herein with reference to FIGS. 2 through 5 may apply to surfaces of the thin lenses 220a, 220b, and 220c. The scatterers 222a, 222b, and 222c included in the thin lenses 220a, 220b, and 220c may have pillar structures. The scatterers 222a, 222b, and 222c may have a shape of a cross-section of the pillar structure that may be from among a circle, an oval, a rectangle, and a square. Also, the scatterers 222a, 222b, and 222c may have a polygonal prism shape or a pillar structure with a cross-section having an "L"-like shape. Shapes of the scatterers 222a, 222b, and 222c may not have symmetricity in a direction. For example, a cross-section of the scatterers 222a, 222b, and 222c may have a shape that is not symmetrical in a horizontal direction as, for example, an oval shape. Also, when cross-sections of the scatterers 222a, 222b, and 222c differ according to its height, the shapes of the scatterers 222a, 222b, and 222c may be asymmetric with respect to the height.

Shapes of the scatterers 222a, 222b, and 222c may vary depending on focal lengths of the thin lenses 220a, 220b, and 220c. For example, scatterers 222a included in the first thin-lens 220a may have a shape appropriate to concentrate pieces of light to have a first focal length $f_1$. In one exemplary embodiment, a cross-sectional shape of the scatterers 222a and a ratio between a width and a height of the scatterers 122a may change. Also, scatterers 222b included in the second thin-lens 220b may have a shape appropriate to concentrate pieces of light to have a second focal length $f_2$. Also, scatterers 222c included in the third thin-lens 220c may have a shape appropriate to concentrate pieces of light to have a third focal length $f_3$. At least two from among the first through third focal lengths $f_1$, $f_2$, and $f_3$ may be different from each other. Also, interval distances among the scatterers 222a, 222b, and 222c and heights of the scatterers 222a, 222b, and 222c may differ according to focal lengths of the thin lenses 220a, 220b, and 220c.

When the focal lengths of the thin lenses 220a, 220b, and 220c change, images that are defocused to different degrees may be formed on the light-sensing cells 230a, 230b, and 230c. Defocusing degrees of the images formed on the light-sensing cells 230a, 230b, and 230c may differ according to the focal lengths of the thin lenses 220a, 220b, and 220c and distances between an object and the thin lenses 220a, 220b, and 220c. Therefore, when a defocusing degree for each position of an image measured by each of the light-sensing cells 230a, 230b, and 230c is compared with those of images measured by light-sensing cells and then extracted, distances between the thin lenses 220a, 220b, and 220c and the object and a 3-dimensional shape may be obtained.

Figure 11:
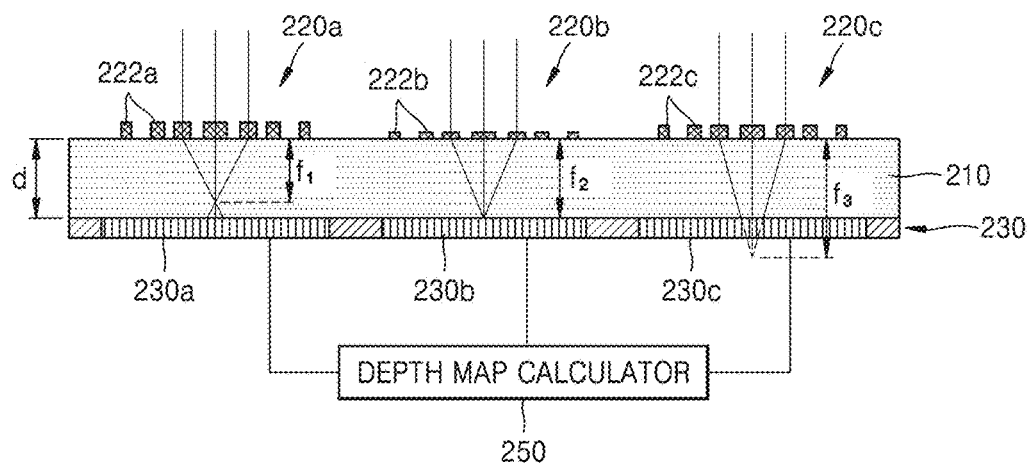
FIG. 11 is a view illustrating an image sensor according to an exemplary embodiment.

FIG. 11 is a view illustrating an image sensor according to an exemplary embodiment.

Referring to FIG. 11, the image sensor may further include a depth map calculator 250 that is configured to calculate depth map information of an image corresponding to incident light. The depth map calculator 250 may receive images measured by the light-sensing cells 230a, 230b, and 230c. Also, the depth map calculator 250 may recognize a relative blur degree for each position of the images measured by one from among the light-sensing cells 230a, 230b, and 230c. Also, the depth map calculator 250 may calculate a defocusing degree for each position of the images measured by one from among the light-sensing cells 230a, 230b, and 230c.

The depth map calculator 250 may calculate depth map information of an image corresponding to the incident light from the defocusing degree measured by each of the light-sensing cells 230a, 230b, and 230c and the focal length of each of the thin lenses 220a, 220b, and 220c. For example, the depth map calculator 250 may calculate a distance from each of a plurality of points on each of objects or a surface of an object included in the image to each of the thin lenses 220a, 220b, and 220c. In this regard, as the depth map calculator 250 calculates the depth map information, the image sensor may obtain a 3-dimensional image of the object.

The thin lenses 220a, 220b, and 220c may each concentrate pieces of light having a predetermined wavelength component. The thin lenses 220a, 220b, and 220c may function as an optical device with respect to a predetermined wavelength band of incident light. Shapes, a shape of arrangement, interval distances, and heights of the scatterers 222a, 222b, and 222c included in the thin lenses 220a, 220b, and 220c may be determined according to wavelength selectivity of the thin lenses 220a, 220b, and 220c.

For example, to output an image with one color, all the thin lenses 220a, 220b, and 220c may have substantially the same wavelength selectivity. The thin lenses 220a, 220b, and 220c may all concentrate light of substantially the same wavelength component. Also, shapes, a shape of arrangement, interval distances, and heights of the scatterers 222a, 222b, and 222c included in the thin lenses 220a, 220b, and 220c may be determined according to focal lengths of the thin lenses 220a, 220b, and 220c. Heights and interval distances of the scatterers 222a, 222b, and 222c may be smaller than a wavelength of light that is concentrated by the thin lenses 220a, 220b, and 220c.

Figure 12:
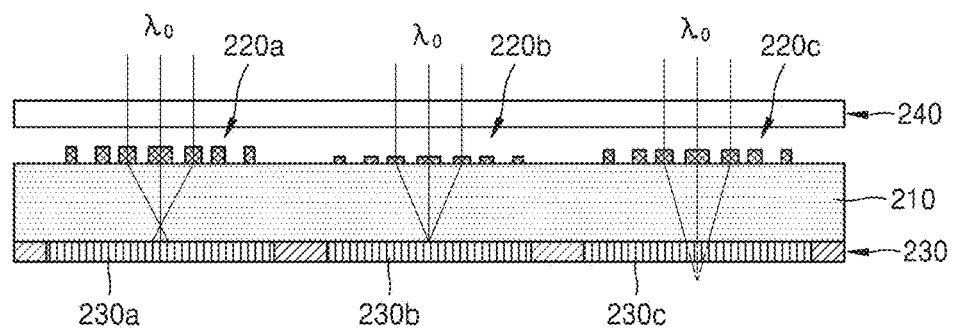
FIG. 12 is a view illustrating an image sensor according to an exemplary embodiment.

FIG. 12 is a view illustrating an image sensor according to an exemplary embodiment.

Referring to FIG. 12, the image sensor may include a light filter layer 240 that filters wavelength components of light incident on each of the light-sensing cells 230a, 230b, and 230c. Although the light filter layer 240 illustrated in FIG. 12 is prepared at a position where the light incident on the light-sensing cells 230a, 230b, and 230c travels, exemplary embodiments are not limited thereto. In one or more exemplary embodiments, the light filter layer 240 may be positioned between the thin lenses 220a, 220b, and 220c and the light sensing layer 230 including the light-sensing cells 230a, 230b, and 230c. The light filter layer 240 may allow a predetermined wavelength $\lambda_0$ component among the incident light to transmit therethrough and may reflect or absorb the remaining wavelength components. Because the light filter layer 240 filters the wavelengths of the incident light, noise light of undesired wavelengths may be prevented from being incident on the light-sensing cells 230a, 230b, and 230c. Also, quality of images obtained from the light-sensing cells 230a, 230b, and 230c may improve.

The thin lenses 220a, 220b, and 220c may each concentrate pieces of light having different wavelengths to have different focal lengths. For example, the first thin-lens 220a may concentrate light having a first wavelength $\lambda_1$ to have a first focal length $f_1$. The scatterers 222a included in the first thin-lens 220a may have a shape of arrangement and interval distances appropriate to concentrate pieces of light having the first wavelength $\lambda_1$ to have the first focal length $f_1$. Also, the second thin-lens 220b may concentrate light having a second wavelength $\lambda_2$ to have a second focal length $f_2$. The scatterers 222b included in the second thin-lens 220b may have a shape of arrangement and interval distances appropriate to concentrate pieces of light having the second wavelength $\lambda_2$ to have the second focal length $f_2$. Also, the third thin-lens 220c may concentrate light having a third wavelength $\lambda_3$ to have a third focal length $f_3$. The scatterers 222c included in the third thin-lens 220c may have a shape of arrangement and interval distances appropriate to concentrate pieces of light having the third wavelength $\lambda_3$ to have the third focal length $f_3$.

Heights and interval distances of the scatterers 222a, 222b, and 222c included in the thin lenses 220a, 220b, and 220c may vary according to wavelength selectivities of 220a, 220b, and 220c, respectively. For example, interval distances between the scatterers 222a and heights of the scatterers 222a in the first thin-lens 220a may be smaller than the first wavelength $\lambda_1$. Also, interval distances between the scatterers 222b and heights of the scatterers 222b in the second thin-lens 220b may be smaller than the second wavelength $\lambda_2$. Also, interval distances between the scatterers 222c and heights of the scatterers 222c in the third thin-lens 220c may be smaller than the third wavelength $\lambda_3$.

Figure 13:
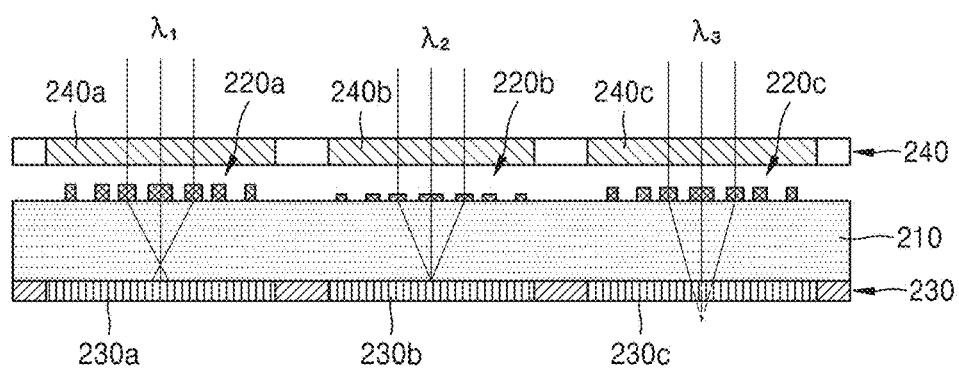
FIG. 13 is a view illustrating an image sensor according to an exemplary embodiment.

FIG. 13 is a view illustrating an image sensor according to an exemplary embodiment.

Referring to FIG. 13, the image sensor may include a light filter layer 240 configured to filter wavelength components of light incident on each of the light-sensing cells 230a, 230b, and 230c. The light filter layer 240 may include a plurality of light filters 240a, 240b, and 240c. The light filters 240a, 240b, and 240c may be applied in correspondence to the light-sensing cells 230a, 230b, and 230c. For example, a first light filter 240a may be configured to filter a wavelength of light incident on a first light-sensing cell 230a. Also, a second light filter 240b may be configured to filter a wavelength of light incident on a second light-sensing cell 230b. Also, a third light filter 240c may be configured to filter a wavelength of light incident on a third light-sensing cell 230c.

The first light filter 240a may transmit a predetermined wavelength component among incident light according to a wavelength selectivity of the first thin-lens 220a. For example, the first light filter 240a may allow light having a first wavelength $\lambda_1$ to transmit therethrough and reflect or absorb light of the remaining wavelength components. In the same manner, the second light filter 240b may allow light having a second wavelength $\lambda_2$ to transmit therethrough and reflect or absorb light of the remaining wavelength components. Also, the third light filter 240c may allow light having a third wavelength $\lambda_3$ to transmit therethrough and reflect or absorb light of the remaining wavelength components. Because the light filters 240a, 240b, and 240c filter wavelengths of incident light, noise light of undesired wavelengths may be prevented from being incident on the light-sensing cells 230a, 230b, and 230c. Also, quality of images obtained from the light-sensing cells 230a, 230b, and 230c may improve. Further, the light-sensing cells 230a, 230b, and 230c each generate images in different colors, and thus a multi-color image may be produced by synthesizing the images.

As described above, according to the one or more of the above exemplary embodiments, an image sensor has been described with reference to FIGS. 1 through 13. The image sensor may concentrate pieces of incident light by using a plurality of thin lenses. In this regard, a size of the image sensor may be reduced. Also, at least one from among a plurality of operation characteristics of the thin lenses may be controlled by changing at least one from among shapes, a shape of arrangement, interval distances, and sizes of the thin lenses. Therefore, the image sensor may be easily manufactured. In addition, a 3-dimensional image, a multi-color image, and depth map information of an object may be easily obtained from imaged generated from a plurality of light-sensing cells.

The foregoing exemplary embodiments are examples and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. An image sensor comprising:
a substrate;
thin lenses disposed on a first surface of the substrate and configured to concentrate lights incident on the first surface;
light-sensing cells disposed on a second surface of the substrate, the second surface facing the first surface, and the light-sensing cells being configured to sense lights passing through the thin lenses, and generate electrical signals based on the sensed lights,
wherein a first thin lens and a second thin lens of the thin lenses are configured to concentrate a first light and a second light, respectively, of the incident lights onto the light-sensing cells with different focal lengths, the first light having a different wavelength than the second light, and
wherein each of the thin lenses comprises scatterers, the scatterers including material having a refractive index higher than a refractive index of the substrate; and
a depth map calculator configured to calculate a defocusing degree of an image that is produced on each of the light-sensing cells, and calculate depth map information about an image that is produced by the incident lights, based on the defocusing degree.

2. The image sensor of claim 1, wherein the substrate comprises sub-substrates, and
the thin lenses and the light-sensing cells are respectively disposed on a first surface and a second surface of each of the sub-substrates.

3. The image sensor of claim 1, wherein each of the scatterers has a pillar structure.

4. The image sensor of claim 3, wherein an interval distance between a pair of the scatterers is less than a respective wavelength of light concentrated by a respective one among the thin lenses.

5. The image sensor of claim 3, wherein a height of the scatterers is less than a respective wavelength of light concentrated by a respective one among the thin lenses.

6. The image sensor of claim 3, wherein the scatterers comprise at least one from among silicon, gallium phosphide, SiC, SiN, and $TiO_2$.

7. The image sensor of claim 3, wherein shapes of the scatterers and interval distances between respective pairs of the scatterers vary with a respective wavelength of light concentrated by a respective one among the thin lenses.

8. The image sensor of claim 1 further comprising light filters, each of the light filters being configured to filter a respective wavelength of light incident on a respective one among the light-sensing cells.

9. The image sensor of claim 1 further comprising an image synthesizer configured to generate a multi-color image by synthesizing images of different colors,
wherein at least two among the light-sensing cells produce the images of different colors.

10. An image sensor comprising:
a substrate;
thin lenses disposed on a first surface of the substrate and configured to concentrate lights incident on the first surface;
light-sensing cells disposed on a second surface of the substrate, the second surface facing the first surface, and the light-sensing cells being configured to sense lights passing through the thin lenses, and generate electrical signals based on the sensed lights,
wherein a first thin lens and a second thin lens of the thin lenses are configured to concentrate a first light and a second light, respectively, of the incident lights to have different focal lengths, and
wherein each of the thin lenses comprises scatterers, the scatterers including material having a refractive index higher than a refractive index of the substrate; and a depth map calculator configured to calculate a defocusing degree of an image that is produced on each of the light-sensing cells, and calculate depth map information about an image that is produced by the incident lights, based on the defocusing degree.

11. The image sensor of claim 10, wherein the substrate comprises sub-substrates, and
the thin lenses and the light-sensing cells are respectively disposed on a first surface and a second surface of each of the sub-substrates.

12. The image sensor of claim 10, wherein the concentrated lights have predetermined wavelengths.

13. The image sensor of claim 10, wherein each of the scatterers has a pillar structure.

14. The image sensor of claim 13, wherein an interval distance between a pair of the scatterers is less than a respective wavelength of light concentrated by a respective one among the thin lenses.

15. The image sensor of claim 13, wherein a height of the scatterers is less than a respective wavelength of light concentrated by a respective one among the thin lenses.

16. The image sensor of claim 13, wherein shapes of the scatterers and interval distances between respective pairs of the scatterers vary with a respective wavelength of light concentrated by a respective one among the thin lenses.

17. The image sensor of claim 10 further comprising a light filter layer configured to filter a wavelength of light incident on each of the light-sensing cells.

* * * * *